US011150660B1

(12) United States Patent
Kabirzadeh et al.

(10) Patent No.: US 11,150,660 B1
(45) Date of Patent: Oct. 19, 2021

(54) SCENARIO EDITOR AND SIMULATOR

(71) Applicant: Zoox, Inc., Foster City, CA (US)

(72) Inventors: Rasoul Kabirzadeh, Redwood, CA (US); Bryan Matthew O'Malley, Oviedo, FL (US)

(73) Assignee: Zoox, Inc., Foster City, CA (US)

( * ) Notice: Subject to any disclaimer, the term of this patent is extended or adjusted under 35 U.S.C. 154(b) by 248 days.

(21) Appl. No.: 16/392,094

(22) Filed: Apr. 23, 2019

(51) Int. Cl.
  *G05D 1/02* (2020.01)
  *G05D 1/00* (2006.01)
  *G06F 30/20* (2020.01)

(52) U.S. Cl.
  CPC ......... *G05D 1/0214* (2013.01); *G05D 1/0088* (2013.01); *G06F 30/20* (2020.01); *G05D 2201/0213* (2013.01)

(58) Field of Classification Search
  CPC .............. G05D 1/0214; G05D 1/0088; G05D 2201/0213; G06F 30/20
  See application file for complete search history.

(56) References Cited

U.S. PATENT DOCUMENTS 10,852,721 B1 * 12/2020 Smith .................. G07C 5/0808

* cited by examiner

*Primary Examiner* — Michael D Lang
(74) *Attorney, Agent, or Firm* — Lee & Hayes, P.C.

(57) ABSTRACT

A vehicle can capture data for use in a simulator. Objects represented in the vehicle data can be instantiated in simulation and move according to object models/controllers. A user can tune how closely simulated motion of the object corresponds to the previously recorded data based on simulation costs. The scenarios can be used for testing and validating interactions and responses of a vehicle controller within a simulated environment. The scenarios can include simulated objects that traverse the simulated environment and perform actions based on the captured data and/or interactions within the simulated environment. Objects observed by the vehicle can be disregarded from simulation based on one or more filters. A user can override, augment, or otherwise modify simulations instantiated based on the one or more filters and captured data.

19 Claims, 7 Drawing Sheets

SCENARIO EDITOR AND SIMULATOR

BACKGROUND

Various systems can leverage simulated data in order to validate functionality in a multitude of tests which would be otherwise prohibitive to test in the real world (e.g., due to safety concerns, limitations on time, etc.). The more realistic these tests are, the more beneficial for validation. For example, when testing functionality of an autonomous vehicle a vehicle (which may be another vehicle) can capture data associated with an environment as the vehicle traverses the environment. The data can be used to generate a simulation to test how an autonomous vehicle controller would react given the same or similar input. The simulation can be used to test and validate the operation of a vehicle controller.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
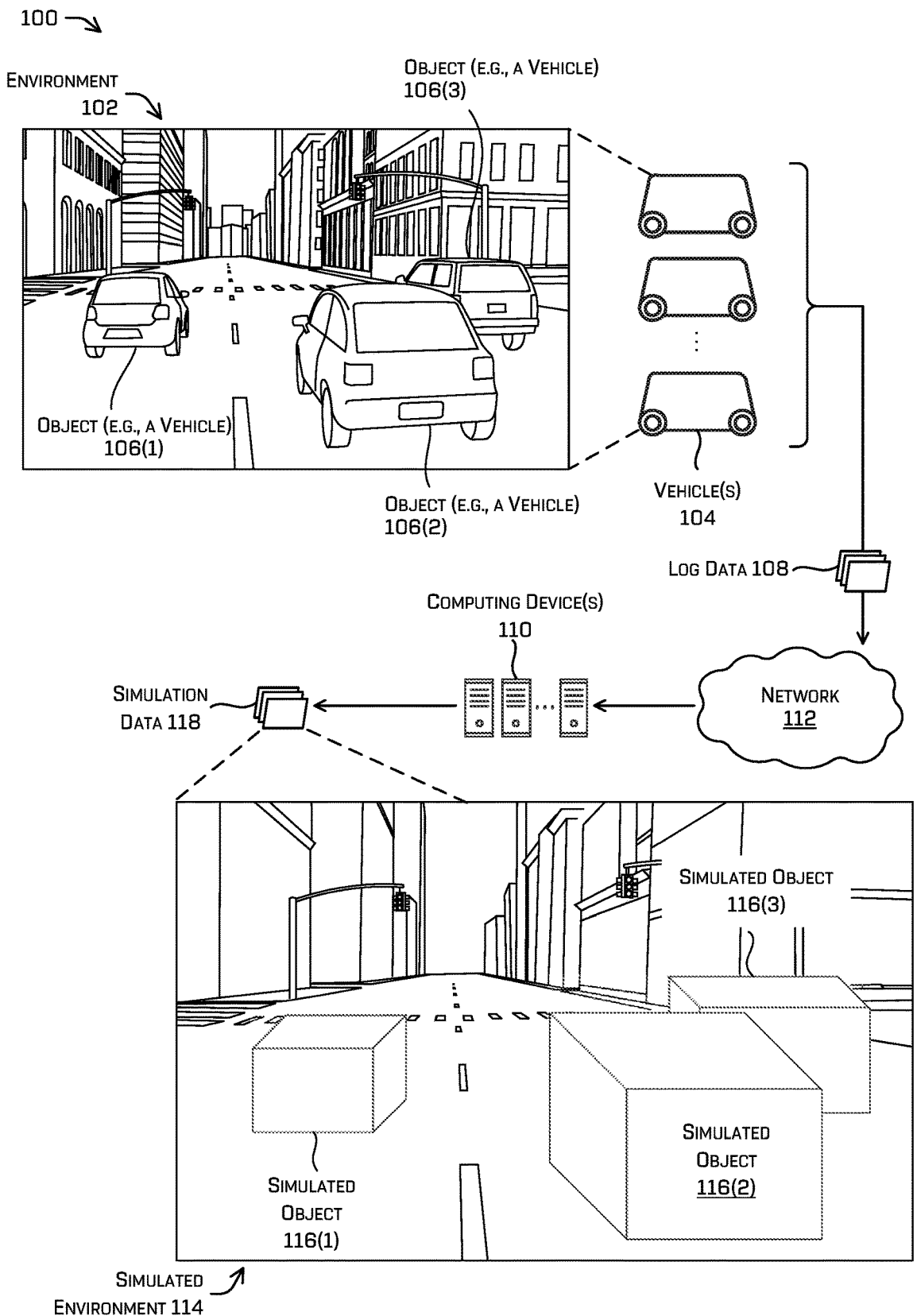
FIG. 1 is an illustration of a vehicle(s) generating log data and transmitting the log data to a computing device(s) that generates simulation data where the simulation data represents a response of a vehicle controller operating in a simulated environment.

This disclosure describes systems, methods, and apparatuses for generating simulation scenarios to test a controller of an autonomous vehicle, which, in at least some examples, may be based on previously recorded sensor data. Simulations can be used to validate software (e.g., an autonomous controller) executed on autonomous vehicles to ensure that the software is able to safely control such autonomous vehicles. In additional or alternative examples, simulations can be used to learn about the constraints of autonomous vehicles that use the autonomous controller. For instance, simulations can be used to understand the operational space of an autonomous vehicle (e.g., an envelope of parameters in which the autonomous controller effectively controls the autonomous vehicle) in view of surface conditions, ambient noise, faulty components, etc. Simulations can also be useful for generating feedback for improving operations and designs of autonomous vehicles. For instance, in some examples, simulations can be useful for determining an amount of redundancy that is required in an autonomous controller, or how to modify a behavior of the autonomous controller based on what is learned through simulations. Furthermore, in additional and/or alternative examples, simulations can be useful to inform the hardware design of autonomous vehicles, such as optimizing placement of sensors on an autonomous vehicle.

When creating a simulation environment to perform testing and validation, it is possible to specifically enumerate the environment with various and specific examples. Each instantiation of such an environment can be unique and defined. Enumerating all possible scenarios manually can require inordinate amounts of time and, if not every possible scenario is constructed, various scenarios can go untested. Additionally, even though multiple scenarios can be described, there is no guarantee that the additional scenarios provide any additional, useful, information. For example, incremental differences in starting positions of simulated vehicles at an intersection can only provide marginal, if any, additional useful information about the ability of an autonomous vehicle to respond in the scenario given a particular set of computer code. Therefore, previously recorded sensor data can be used to quickly and efficiently generate high quality scenarios for testing.

For example, a vehicle or multiple vehicles can traverse an environment and generate log data associated with the environment. The log data can be used to generate a simulated environment. Within the simulated environment, motion of simulated objects can be initialized based on the log data, but can vary based on costs and/or waypoints associated with the simulated objects as the simulated objects react to a simulated autonomous vehicle or vehicle controller.

The log data can include sensor data captured by one or more sensors of the vehicle, perception data indicating objects identified by one or more systems onboard the vehicle (or produced during a post-processing phase), prediction data indicating an intent of objects (whether produced during the recording or subsequent thereto), and/or status data indicating diagnostic information, trajectory information, and other information generated by the vehicle.

The vehicle can transmit the log data, via a network, to a database that stores log data and/or to a computing device executing a scenario editor and simulator (SES). As discussed above, the log data can include perception data that identifies objects (e.g., roads, sidewalks, road markers, signage, traffic lights, other vehicles, pedestrians, cyclists, animals, etc.) and/or bounding boxes that represent the objects. The SES can use the log data to generate a simulated scenario. For example, the environment (e.g., roads, buildings, signage, etc.) traversed by the vehicle can be represented as a simulated environment in the simulated scenario. The simulated scenario can be identical to the captured environment or deviate from the captured environment. For example, the simulated environment can have more or fewer number of buildings as in the captured environment. Additionally, objects (e.g., other vehicles, pedestrians, animals, cyclists, etc.) in the log data can be represented as simulated objects and the vehicle can be represented as a simulated vehicle. In at least some examples, such simulated data may comprise only information about static and dynamic entities (e.g., exclusive of buildings, roads, etc.). In such examples, the simulated environment may comprise previously generated (or otherwise available) maps and/or representations of the recorded environment.

The simulated vehicle can represent an autonomous vehicle that is controlled by an autonomous controller that can determine a trajectory, based at least in part, on the simulated environment. In such an example, the same and/or similar systems may be tested in software and/or hardware. The SES can generate a user interface allowing a user to view a graphical representation of the simulated environment and/or edit the simulated scenario.

The log data can include an event of interest. In some instances, an event of interest can include detecting a collision with another object, a violation of a traffic rule (e.g., a speed limit), and/or a disengagement where a human driver takes control of the operation of the vehicle from an autonomous controller. In some instances, an event of interest can include an error condition and/or a warning such as a low battery power event. Further, an event of interest can include a lane change, a change of direction (of object(s) in the environment), and/or a change in velocity (of object(s) in the environment).

In some instances, the computing device can be configured to detect a safety concern and/or an uncertainty and transmit a request, in addition to the status data, to a remote computing device associated with a teleoperator. The teleoperator can assess the situation and provide guidance to the vehicle. After receiving the guidance (and/or a command, in general), the vehicle can continue operation in order to achieve a safe outcome in response to the event of interest. For example, an object can block a roadway that can lead to the vehicle determining a different route from a preplanned route or a teleoperator can provide the guidance to respond to the blockage. In some instances, the vehicle can generate an event marker in the log data that provides an indication that an event of interest occurred at a particular time. Then, the SES can select the log data, by identifying the event of interest and/or by identifying the event marker. Using the log data and/or the event, the SES can generate a simulated scenario by representing the captured environment in the simulated scenario along with simulated objects.

In some instances, the SES can identify a portion of the log data to use to generate the simulated scenario. For example, the SES can identify a portion of the log data prior to the event that corresponds to a period of time (e.g., 20 seconds) and another portion of the log data following the event that correspond to another period of time (e.g., 10 seconds). In some instances, the SES can use a default period of time and/or the SES can use a user configurable period of time.

The SES can use filters to remove objects from a simulated environment based on parameters associated with the objects. For purposes of illustration only, the log data can include objects of varying sizes such as mailboxes and buildings. The SES can use a volume-based filter such that objects that are associated with a volume greater equal to or greater than three cubic meters are represented in the simulated environment and objects that are associated with a volume less than one cubic meter are not represented in the simulated scenario. In some instances, the SES can use a track length filter where objects that have track lengths (e.g., data associated with a physical distance or a period of time) that do not meet or exceed a track length threshold are filtered from the simulated scenario. This can result in a simulated environment that omits objects associated with poor detections during the time of data capture. In some instances, the SES can use a motion-based filter such that objects associated with motion or a trajectory according to the log data are represented in the simulated environment. In some instances, the filters can be applied in combination or mutually exclusively.

In some instances, a user interface can graphically represent objects that have been filtered out and allow a user to provide an override instruction to override the filter and have the object represented in the simulated environment. In some instances, a user can use the user interface to remove objects that have not been filtered out from the simulated environment.

The SES can execute the simulated scenario and generate simulation data that indicates how an autonomous controller and/or other objects would respond given the simulated scenario. Additionally, the simulation data can indicate how objects would respond given the simulated scenario. For example, the SES can represent the vehicle as a simulated vehicle that traverses the simulated environment using an autonomous controller. In some instances, the simulated vehicle can be controlled using a controller that is the same as or that is different than the controller used by the vehicle that generated the log data. In a scenario where a simulated controller is different than a controller used to capture the log data, the simulated vehicle can perform actions that deviate from the vehicle as represented in the log data. For purposes of illustration only, a simulated controller may represent different planning algorithms or driving behaviors (e.g., different acceleration or braking profiled) that may introduce differences between the log data and simulated data. Additionally, in the event that the vehicle which collected the data was manually operated (even for a small portion of time), there may be the same discrepancies between the actual log data and how the data would evolve given the autonomous vehicle controller.

Additionally, and similarly, the SES can determine the actions of a simulated object in the simulated environment based on the log data. For example, the simulated object can perform actions associated with the object as represented in the log data. In some instances, the SES can associate a controller with the simulated object, where the controller can determine trajectories for the object that deviate from the log data. Thus, the simulated object can perform actions associated with the object as represented in the log data and/or perform actions that deviate from the object as represented in the log data. Thus, the simulated object can intelligently react to deviations in the behavior of the simulated vehicle. For purposes of illustration only, in a scenario where a simulated object is following a simulated vehicle, if the simulated vehicle begins braking sooner or more aggressively than the braking behavior represented in the log data, the simulated object may modify its trajectory by braking sooner or changing lanes, for example, to avoid a collision or near-collision with the simulated vehicle.

In some instances, the controller associated with the simulated vehicle can be the same controller associated with the simulated objects. In some instances, the SES can associate a controller with the simulated vehicle that is different from the controller associated with the simulated objects. In some instances, the SES can determine a difference between actions performed by the object as represented in the log data and actions performed by the simulated object in the simulation data.

In some examples, the SES can determine waypoint(s) and/or paths associated with a simulated object. For purposes of illustration only such waypoints or paths can be based at least in part on log data representing the object corresponding to the simulated object. In some examples, waypoints can be determined based on a curvature of a path segment or can be added manually in a user interface, discussed herein. Such waypoints or paths can be associated with various costs or weights that influence a behavior of the simulated object in the simulated environment. For example, a waypoint may be associated with a position cost or a time cost that enforces a distance or position of the simulated object in the simulated environment. Such waypoints or paths can be associated with events or actions, such as a lane change action. For example, the log data can indicate that an object performed a lane change action that placed the object to the right of the vehicle. Additionally, the log data can indicate that the vehicle attempted to perform a lane change action to the right but did not complete the action due to the object. In order to preserve this interaction in the simulated scenario, the SES can assign a waypoint associated with the trajectory of the simulated object such that the simulated object performs the lane change action and remains on the right side of the simulated vehicle. Controllers associated with the simulated vehicle may then, in such examples, determine controls for the simulated vehicle which adapt to changes in the scenario while minimizing deviations from the paths as originally taken.

Additionally, the SES can determine a simulation cost associated with various parameters associated with the simulated vehicle and/or the simulated objects. For purposes of illustration only, and as discussed above, the SES can associate a waypoint and/or a path with the simulated object to influence the behavior of the simulated object in the simulated environment. In some cases, motion of the simulated object may be based at least in part on one or more costs, including but not limited to a reference cost (e.g., a cost based on a distance of the simulated object from a reference trajectory, such as the path of the object represented in the log data), an obstacle cost (e.g., a cost based on a distance between the simulated object and other object(s) in the simulated environment), an acceleration cost (e.g., a cost associated with speeding up or slowing down, such as maximum and/or minimum acceleration(s)), and/or a steering cost (e.g., a cost based on steering angle(s) of the simulated object, which may or may not be based on a velocity of the simulated object), although other costs are contemplated. The controller of the simulated object can determine an alternate trajectory and have an associated simulation cost. In some instances, a first trajectory can be associated with a simulation cost that is higher than a second trajectory and the planner can determine to execute the trajectory associated with a lower simulation cost.

In some instances, the SES can associate weights to various vehicle parameters, waypoints, trajectories, and the like. For purposes of illustration only, and as discussed above, the simulated object can have a simulation cost associated with a first trajectory associated with a waypoint that places the simulated object to the right of the simulated vehicle. Additionally, the simulated object can determine a second trajectory that does not place the simulated object to the right of the simulated vehicle. A weight can be assigned to the first trajectory and/or the second trajectory. For example, the purpose of the simulation can be to determine how the simulated vehicle responds when the simulated object is to the right of the simulated vehicle. A user can adjust the weight associated with the first trajectory and assign it a weight that is significantly higher than the weight assigned to other trajectories. In some instances, a trajectory associated with a higher cost can still be the trajectory traversed by a simulated object if the weight is sufficient to overcome the cost difference with other trajectories associated with a lower cost. In such examples, weighting may be indicative of how much a simulated vehicle's trajectory can differ from an associated previously recorded trajectory.

The techniques discussed herein can improve a functioning of a computing device by increasing the ability for the computing device to determine outcomes and reducing an amount of required computational resources. For example, a computing device associated with a vehicle can determine one or more trajectories while traversing an environment. The computing device can use a controller than has executed similar trajectories in similar simulated environments and can have reference costs associated with the trajectories. Then, the computing device can determine an appropriate trajectory based at least in part on the reference cost and reduce an amount of computational resources (e.g., processing power, network utilization, etc.) required to determine the appropriate trajectory.

Therefore, the functioning of a computing device can be increased by increasing the computing device's ability to determine realistic trajectories and behaviors of simulated objects in an environment. As can be understood, determining an appropriate trajectory for a vehicle can improve safety outcomes, particularly in the context of autonomous vehicle by, for example, producing more realistic reactions to adaptations in vehicle behavior in an environment. Thus, the techniques described herein can improve a functioning of a computing device as well as improve safety outcomes.

The techniques described herein can be implemented in a number of ways. Example implementations are provided below with reference to the following figures. Although discussed in the context of an autonomous vehicle, the techniques described herein can be applied to a variety of systems requiring determination and detection of objects, and is not limited to autonomous vehicles. In another example, the systems, methods, and apparatuses can be used in an aviation or in a nautical context. Additionally, the techniques described herein can be used with real data (e.g., captured using sensor(s)), simulated data (e.g., generated by a simulator), or any combination of the two.

FIG. 1 illustrates a pictorial flow diagram 100 that depicts an environment 102 through which example vehicle(s) 104 are traveling. The vehicle(s) 104 can be a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In such examples, because the vehicle(s) 104 can be configured to control all functions from start to completion of the trip, including all parking functions, it may not include a driver and/or controls for driving the vehicle(s) 104, such as a steering wheel, an acceleration pedal, and/or a brake pedal. This is merely an example, and the systems and methods described herein may be incorporated into any groundborne, airborne, or waterborne vehicle, including those ranging from vehicles that need to be manually controlled by a driver at all times, to those that are partially or fully autonomously controlled.

The vehicle(s) 104 can be any configuration of vehicle, such as, for example, a van, a sport utility vehicle, a cross-over vehicle, a truck, a bus, an agricultural vehicle, and/or a construction vehicle. The vehicle(s) 104 can be powered by one or more internal combustion engines, one or more electric motors, hydrogen power, any combination thereof, and/or any other suitable power sources. Although the vehicle(s) 104 has four wheels, the systems and methods described herein can be incorporated into vehicles having fewer or a greater number of wheels, and/or tires. The vehicle(s) 104 can have four-wheel steering and can operate generally with equal or similar performance characteristics in all directions, for example, such that a first end of the vehicle(s) 104 is the front end of the vehicle(s) 104 when traveling in a first direction, and such that the first end becomes the rear end of the vehicle(s) 104 when traveling in the opposite direction. Similarly, a second end of the vehicle(s) 104 is the front end of the vehicle when traveling in the second direction, and such that the second end becomes the rear end of the vehicle(s) 104 when traveling in the opposite direction. These example characteristics may facilitate greater maneuverability, for example, in small spaces or crowded environments, such as parking lots and/or urban areas.

The vehicle(s) 104 can include a computing device that includes a perception engine and/or a planner and perform operations such as detecting, identifying, segmenting, classifying, and/or tracking objects from sensor data collected from the environment 102. For example, the computing device associated with vehicle(s) 104 can detect objects 106(1)-(3). While objects 106(1)-(3) are depicted as vehicles in environment 102, objects 106(1)-(3) can also include cyclists, pedestrians, animals, road markers, signage, traffic lights, buildings, mailboxes, and/or other objects.

The vehicle computing device can include one or more processor(s) and memory communicatively coupled to the one or more processor(s). The one or more processor(s) can include, for example, one or more FPGAs, SoCs, ASICs, and/or CPUs. The vehicle(s) 104 can traverse through the environment 102 and determine and/or capture data. For example, the vehicle computing device can determine vehicle status data, vehicle diagnostic data, vehicle metrics data, and/or map data. In some instances, the vehicle(s) 104 can include one or more sensors where the one or more sensors can include one or more time-of-flight sensors, lidar sensors, radar sensors, sonar sensors, image sensors, audio sensors, infrared sensors, location sensors, wheel encoders, IMUs, etc., or any combination thereof, although other types of sensors are contemplated.

As the vehicle(s) 104 traverses through the environment 102, the sensors can capture sensor data associated with the environment 102. For example, and as discussed above, some of the sensor data can be associated with objects (e.g., vehicles, cyclists, and/or pedestrians). In some instances, the sensor data can be associated with other objects including, but not limited to, buildings, road surfaces, signage, barriers, etc. Therefore, in some instances, the sensor data can be associated with dynamic objects and/or static objects. The dynamic objects can be, as described above, objects that are associated with a movement (e.g., vehicles, motorcycles, cyclists, pedestrians, animals, etc.) or capable of a movement (e.g., parked vehicles, standing pedestrians, etc.) within the environment 102. The static objects can be, as described above, objects that are associated with the environment 102 such as, for example, buildings/structures, road surfaces, road markers, signage, barriers, trees, sidewalks, etc. In some instances, the vehicle computing device can determine information about objects in the environment, such as bounding boxes, classifications, segmentation information, and the like.

The vehicle computing device can use the sensor data to generate a trajectory for the vehicle(s) 104. In some instances, the vehicle computing device can also determine pose data associated with a position of the vehicle(s) 104. For example, the vehicle computing device can use the sensor data to determine position data, coordinate data, and/or orientation data of the vehicle(s) 104 in the environment 102. In some instances, the pose data can include x-y-z coordinates and/or can include pitch, roll, and yaw data associated with the vehicle(s) 104.

The vehicle computing device can generate log data 108. For example, the log data 108 can include the sensor data, perception data, planning data, vehicle status data, velocity data, intent data, and/or other data generated by the vehicle computing device. In some instances, the sensor data can include data captured by sensors such as time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The senor data can be data captured by such sensors such as time-of-flight data, location data, lidar data, radar data, sonar data, image data, audio data, etc. Such log data may further include intermediate output by any one or more systems or subsystems of the vehicle including, but not limited to, messages indicating object detections, object tracks, predictions of future object locations, pluralities of trajectories generated in response so such detections, control signals passed to one or more systems or subsystems used to effectuate commands, and the like. In some instances, the log data 108 can include time data that is associated with the other data generated by the vehicle computing device.

The vehicle(s) 104 can transmit the log data 108 or a portion of the log data 108 to a computing device(s) 110 via network 112. For example, the vehicle(s) 104 can transmit log data 108 that includes time data, perception data, and/or map data to the computing device(s) 110 to store the log data 108. Examples of data generated by a vehicle that can be included in the log data 108 can be found, for example, in U.S. patent application Ser. No. 15/644,267 titled "Interactions Between Vehicle and Teleoperations System" and filed Jul. 7, 2017 (describing, in part, communication signals that can include sensor data and data indicating an occurrence of an event as well vehicle control data that can be derived from data received from a sensor and a planner, an object data calculator, an object classifier, a collision predictor system, a kinematics calculator, a safety system actuator, and a control operation of the drive system), U.S. patent application Ser. No. 15/693,700 titled "Occupant Protection System Including Expandable Curtain and/or Expandable Bladder" and filed Sep. 1, 2017 (describing, in part, data representative of a trajectory of the vehicle, location data, object data, and vehicle control data), and U.S. patent application Ser. No. 16/198,653 titled "Executable Component Interface and Controller" filed Nov. 21, 2018 (describing, in part, a type of log data), which are each incorporated by reference in their entirety. In some instances, the computing device(s) 110 can include a server that stores the log data 108 in a database. In some instances, the computing device(s) 110 can operate an SES. Such transmission can be wired, wireless, or otherwise, as described in detail herein.

In some instances, the vehicle(s) 104 can be operated remotely by a person. For example, while traversing the environment 102, the vehicle(s) 104 can encounter an event of interest that is unpredictable in nature, represents safety concerns, and/or requires responses to spontaneous visual cues or direction from, for example, police officers or construction workers. The vehicle(s) 104 can be configured to detect that an uncertainty associated with an action (e.g., by determining confidence level(s) associated with a maneuver and/or event). Upon identifying such uncertainty, the vehicle(s) 104 can send a request to a teleoperations device to obtain guidance to resolve the uncertainty and proceed.

Following the request to the teleoperations device, a user interface can quickly and accurately apprise the teleoperator of the situation. In some instances, the vehicle(s) 104 can transmit log data 108 (e.g., sensor data captured by sensors and/or operation state data) with the request. In response to the request, a teleoperator can provide guidance (which may sometimes be referred to as a command, or otherwise information, such as, but not limited to, disregard certain policies, a path to try and follow, or the like) to the vehicle(s) 104. In some instances, the teleoperations device can determine the guidance based at least on the request, sensor data, and/or vehicle state data. In some instances, the vehicle state data can indicate a light status of the vehicle, a door status of the vehicle, a battery status of the vehicle, etc.

The vehicle(s) 104 can be configured to generate an event marker associated with the request to the teleoperations device. In some instances, the vehicle(s) 104 can determine an event of interest and generate an event marker associated with the event of interest without sending a request to the teleoperations device. For purposes of illustration only, the vehicle(s) 104 can use a sensor to detect a sudden braking event. For example, the vehicle(s) 104 can determine that an amount of acceleration meets or exceeds a threshold to detect the sudden braking event. The vehicle(s) 104 can be configured to associate sudden braking events as an event of interest and generate an event marker associated with the sudden braking event. In some instances, the vehicle(s) 104 can generate a log of events of interest in the log data 108 that indicates a type of event of interest as well as a timestamp associated with the event of interest. In some instances, the vehicle(s) 104 can generate an event marker that indicates a time in the log data 108 when the event of interest occurred.

After receiving the log data 108 at the computing device(s) 110, the SES executing on the computing device(s) 110 can determine an event associated with the log data. For example, the vehicle(s) 104, while traversing the environment 102, can determine a lane change action as an event of interest. The vehicle(s) 104 can then transmit the log data 108 to the computing device(s) 110. At the computing device(s) 110, the SES can identify the log data 108 that includes an event of interest by, for example, scanning through the log data 108 for an event of interest and/or my identifying an event marker. In some examples, the log data 108 can be sent to the computing device(s) 110 whereby the computing device(s) 110 can search the log data 108 to determine one or more events (e.g., braking associated with a deceleration above a threshold value, pedestrians crossing a crosswalk, navigating around double-parked vehicles, and the like).

Based on the log data 108, the SES can generate a simulated scenario that includes a simulated environment 114. For example, the log data 108 can include map data and location data indicating a region such as environment 102 and how the vehicle(s) 104 traversed through the region. Additionally, the log data 108 can include status data of the vehicle(s) 104, including but not limited to acceleration data, steering angle data, indicator status data, etc. as the vehicle(s) 104 traversed through the region. The log data 108 can include time data that associates actions of the vehicle(s) 104 and observations (e.g., sensor data) with a set of timestamps. The log data 108 can be used by the SES to generate the simulated environment 114 that recreates the environment 102 and includes simulated objects 116(1)-(3). In some instances, simulated objects 116(1)-(3) can correspond to objects 106(1)-(3), respectively. Additionally, the SES can create the simulated environment 114 that includes more or less detail from environment 102 as depicted in FIG. 1 (e.g., by filtering out objects or by adding additional objects).

The SES can execute the simulated scenario and generate simulation data 118. The simulation data 118 can indicate how an autonomous controller associated with a simulated vehicle responded under the circumstances presented in the simulated scenario as well as how the simulated objects 116(1)-(3) responded.

Figure 2:
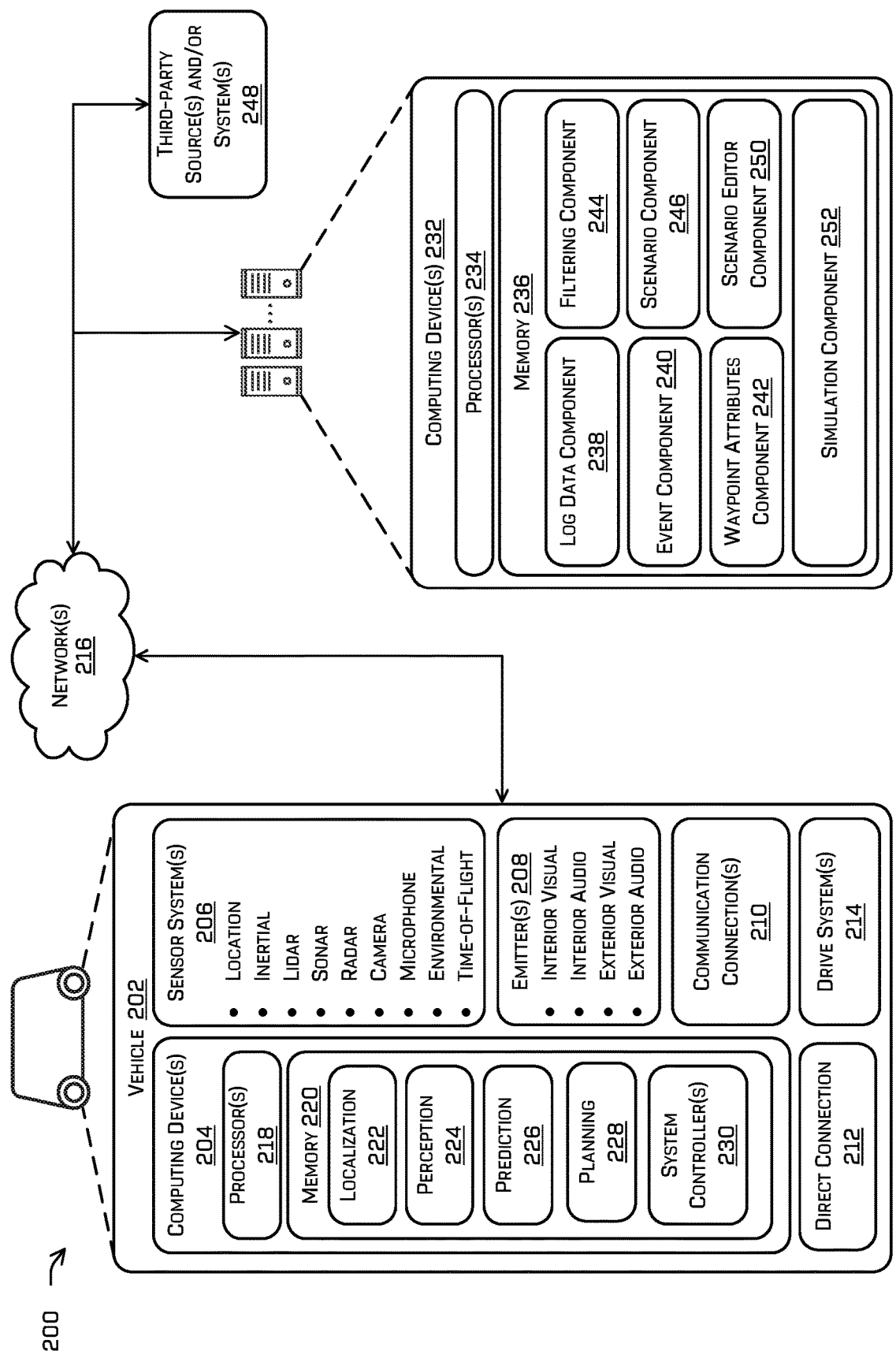
FIG. 2 depicts a block diagram of an example system for implementing the techniques described herein.

FIG. 2 depicts a block diagram of an example system 200 for implementing the techniques discussed herein. In at least one example, the system 200 can include a vehicle 202, which can be similar to the vehicle(s) 104 described above with reference to FIG. 1 In the illustrated example 200, the vehicle 202 is an autonomous vehicle; however, the vehicle 202 can be any other type of vehicle.

The vehicle 202 can include a computing device(s) 204, one or more sensor system(s) 206, one or more emitter(s) 208, one or more communication connection(s) 210 (also referred to as communication devices and/or modems), at least one direct connection 212 (e.g., for physically coupling with the vehicle 202 to exchange data and/or to provide power), and one or more drive system(s) 214. The one or more sensor system(s) 206 can be configured to capture sensor data associated with an environment.

The sensor system(s) 206 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 206 can include multiple instances of each of these or other types of sensors. For instance, the time-of-flight sensors can include individual time-of-flight sensors located at the corners, front, back, sides, and/or top of the vehicle 202. As another example, the camera sensors can include multiple cameras disposed at various locations about the exterior and/or interior of the vehicle 202. The sensor system(s) 206 can provide input to the computing device(s) 204.

The vehicle 202 can also include one or more emitter(s) 208 for emitting light and/or sound. The one or more emitter(s) 208 in this example include interior audio and visual emitters to communicate with passengers of the vehicle 202. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 208 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle 202 can also include one or more communication connection(s) 210 that enable communication between the vehicle 202 and one or more other local or remote computing device(s) (e.g., a remote teleoperations computing device) or remote services. For instance, the communication connection(s) 210 can facilitate communication with other local computing device(s) on the vehicle 202 and/or the drive system(s) 214. Also, the communication connection(s) 210 can allow the vehicle 202 to communicate with other nearby computing device(s) (e.g., other nearby vehicles, traffic signals, etc.).

The communications connection(s) 210 can include physical and/or logical interfaces for connecting the vehicle computing device(s) 204 to another computing device or one or more external networks 216 (e.g., the Internet). For example, the communications connection(s) 210 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 210 may comprise the one or more modems as described in detail above.

In at least one example, the vehicle 202 can include one or more drive system(s) 214. In some examples, the vehicle 202 can have a single drive system 214. In at least one example, if the vehicle 202 has multiple drive systems 214, individual drive systems 214 can be positioned on opposite ends of the vehicle 202 (e.g., the front and the rear, etc.). In at least one example, the drive system(s) 214 can include one or more sensor system(s) 206 to detect conditions of the drive system(s) 214 and/or the surroundings of the vehicle 202. By way of example and not limitation, the sensor system(s) 206 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 214. In some cases, the sensor system(s) 206 on the drive system(s) 214 can overlap or supplement corresponding systems of the vehicle 202 (e.g., sensor system(s) 206).

The drive system(s) 214 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 214 can include a drive system controller which can receive and preprocess data from the sensor system(s) 206 and to control operation of the various vehicle systems. In some examples, the drive system controller can include one or more processor(s) and memory communicatively coupled with the one or more processor(s).

The memory can store one or more modules to perform various functionalities of the drive system(s) 214. Furthermore, the drive system(s) 214 also include one or more communication connection(s) that enable communication by the respective drive system with one or more other local or remote computing device(s).

The computing device(s) 204 can be similar to the vehicle computing device described above with reference to FIG. 1. The computing device(s) 204 can include one or more processor(s) 218 and memory 220 communicatively coupled with the one or more processor(s) 218. In at least one instance, the one or more processor(s) 218 and the memory 220 can be similar to the processor(s) and memory described above with reference to FIG. 1. In the illustrated example, the memory 220 of the computing device(s) 204 stores a localization component 222, a perception component 224, a prediction component 226, a planning component 228, and one or more system controller(s) 230. Though depicted as residing in the memory 220 for illustrative purposes, it is contemplated that the localization component 222, the perception component 224, the prediction component 226, the planning component 228, and the one or more system controller(s) 230 can additionally, or alternatively, be accessible to the computing device(s) 204 (e.g., stored in a different component of vehicle 202 and/or be accessible to the vehicle 202 (e.g., stored remotely).

In memory 220 of the computing device(s) 204, the localization component 222 can include functionality to receive data from the sensor system(s) 206 to determine a position of the vehicle 202. For example, the localization component 222 can include and/or request/receive a three-dimensional map of an environment and can continuously determine a location of the autonomous vehicle within the map. In some instances, the localization component 222 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle. In some instances, the localization component 222 can provide data to various components of the vehicle 202 to determine an initial position of an autonomous vehicle for generating a trajectory, as discussed herein.

The perception component 224 can include functionality to perform object detection, segmentation, and/or classification. In some examples, the perception component 224 can provide processed sensor data that indicates a presence of an entity that is proximate to the vehicle 202 and/or a classification of the entity as an entity type (e.g., car, pedestrian, cyclist, building, tree, road surface, curb, sidewalk, unknown, etc.). In additional and/or alternative examples, the perception component 224 can provide processed sensor data that indicates one or more characteristics associated with a detected entity and/or the environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

The perception component 224 can include functionality to store perception data generated by the perception component 224. In some instances, the perception component 224 can determine a track corresponding to an object that has been classified as an object type. For purposes of illustration only, the perception component 224, using sensor system(s) 206 can capture one or more images of an environment. The sensor system(s) 206 can capture images of an environment that includes an object, such as a pedestrian. The pedestrian can be at a first position at a time T and at a second position at time T+t (e.g., movement during a span of time t after time T). In other words, the pedestrian can move during this time span from the first position to the second position. Such movement can, for example, be logged as stored perception data associated with the object.

The stored perception data can, in some examples, include fused perception data captured by the vehicle. Fused perception data can include a fusion or other combination of sensor data from sensor system(s) 206, such as image sensors, lidar sensors, radar sensors, time-of-flight sensors, sonar sensors, global positioning system sensors, internal sensors, and/or any combination of these. The stored perception data can additionally or alternatively include classification data including semantic classifications of objects (e.g., pedestrians, vehicles, buildings, road surfaces, etc.) represented in the sensor data. The stored perception data can additionally or alternatively include a track data (collections of historical positions, orientations, sensor features, etc. associated with the object over time) corresponding to motion of objects classified as dynamic objects through the environment. The track data can include multiple tracks of multiple different objects over time. This track data can be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The prediction component 226 can generate one or more probability maps representing prediction probabilities of possible locations of one or more objects in an environment. For example, the prediction component 226 can generate one or more probability maps for vehicles, pedestrians, animals, and the like within a threshold distance from the vehicle 202. In some instances, the prediction component 226 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

The planning component 228 can determine a path for the vehicle 202 to follow to traverse through an environment. For example, the planning component 228 can determine various routes and paths and various levels of detail. In some instances, the planning component 228 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 228 can generate an instruction for guiding the autonomous vehicle along at least a portion of the route from the first location to the second location. In at least one example, the planning component 228 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 228 can alternatively, or additionally, use data from the perception component 224 to determine a path for the vehicle 202 to follow to traverse through an environment. For example, the planning component 228 can receive data from the perception component 224 regarding objects associated with an environment. Using this data, the planning component 228 can determine a route to travel from a first location (e.g., a current location) to a second location (e.g., a target location) to avoid objects in an environment. In at least some examples, such a planning component 228 may determine there is no such collision free path and, in turn, provide a path which brings vehicle 202 to a safe stop avoiding all collisions and/or otherwise mitigating damage.

In at least one example, the computing device(s) 204 can include one or more system controller(s) 230, which can be configured to control steering, propulsion, braking, safety, emitters, communication, and other systems of the vehicle 202. These system controller(s) 230 can communicate with and/or control corresponding systems of the drive system(s) 214 and/or other components of the vehicle 202, which may be configured to operate in accordance with a path provided from the planning component 228.

The vehicle 202 can connect to computing device(s) 232 via network 216 and can include one or more processor(s) 234 and memory 236 communicatively coupled with the one or more processor(s) 234. In at least one instance, the one or more processor(s) 234 can be similar to the processor(s) 218 and the memory 236 can be similar to the memory 220. In the illustrated example, the memory 236 of the computing device(s) 232 stores a log data component 238, an event component 240, a waypoints attributes component 242, a filtering component 244, a scenario component 246, a scenario editor component 250, and a simulation component 252. Though depicted as residing in the memory 236 for illustrative purposes, it is contemplated that the log data component 238, the event component 240, the waypoints attributes component 242, the filtering component 244, the scenario component 246, the scenario editor component 250, and the simulation component 252 can additionally, or alternatively, be accessible to the computing device(s) 232 (e.g., stored in a different component of computing device(s) 232 and/or be accessible to the computing device(s) 232 (e.g., stored remotely).

In the memory 236 of the computing device(s) 232, the log data component 238 can determine log data to be used for generating a simulated scenario. As discussed above, a database can store one or more log data. In some instances, the computing device(s) 232 can act as the database to store the log data. In some instances, the computing device(s) 232 can connect to a different computing device to access the log data database. The log data component 238 can use the event component 240 to scan log data stored in the database and identify log data that contains an event of interest. As discussed above, in some instances, the log data can include an event marker that indicates that an event of interest is associated with a particular log data. In some instances, a user can select a log data of a set of log data to be used to generate a simulated scenario.

Additionally, the event component 240 can identify log data that contains an event of interest by scanning actions taken by the vehicle 202 associated with the log data. For example, the event component 240 can determine from the log data that the vehicle 202 made a rapid steering adjustment and determine that as an event of interest. In some instances, the event component 240 can determine from the log data that the vehicle 202 encountered an object in the road that interfered with the vehicle's 202 trajectory and determine that as an event of interest. In some instances, the event component 240 can use thresholds (e.g., a steering threshold, an acceleration threshold, etc.) to determine events of interest represented in the log data. In some instances, the event component 240 can determine a collision based on, for example, perception data indicating two or more objects occupying a same region in the environment. In some instances, the event component 240 can identify an event marker that is represented in the log data. In some instances, the user can select a location of the environment and/or a timestamp of the log data as an event of interest and the event component 240 can determine a portion of the log data associated with the location and/or time stamp to generate the simulated scenario. Techniques for identifying events can be found, for example, in U.S. patent application Ser. No. 16/224,385 titled "Event-Based Data Logging" and filed Dec. 18, 2018, which is incorporated by reference herein in its entirety.

The waypoint attributes component 242 can determine attributes associated with a waypoint. As discussed above, a controller can be associated with the simulated objects and can determine how to guide the simulated object from a first waypoint in a sequence of waypoints to a second waypoint in the sequence of waypoints. The waypoint attributes component 242 can determine attributes such as, for example, a speed, a steering angle, or a time associated with the waypoint (e.g., to enforce the simulated object to simulate a speed and/or a steering angle at a waypoint in the simulated environment, to arrive at a waypoint at a specified time in the simulated scenario (or within a period of time), and/or to perform a specified action at a specified time in the simulated scenario (or within a period of time)). In another example, a waypoint may enforce a location of a simulated object at a particular time in the simulated data. Of course, such waypoints may be associated with any one or more additional parameters, such as, for example, yaw rates, accelerations, predicted trajectories, uncertainties, and any other data associated with entities in the data. In some examples, a waypoint can be associated with various weight(s) that represent an "importance" of enforcing a behavior of the simulated object with respect to the waypoint. In some examples, the weight(s) associated with a waypoint can influence a cost associated with the simulated object deviating from or adhering to the waypoint behavior.

For purposes of illustration only, the log data can indicate that the object traversed a trajectory that included executing a turn at 5 mph and with a steering angle of 30 degrees. The waypoint attributes component 242 can determine a waypoint associated with the simulated object that has attributes of a speed of 5 mph and a steering angle of 30 degrees at the location as represented in the log data. As the computing device(s) 232 executes the simulated scenario, the waypoints can guide the simulated object in the simulated environment by applying the attributes associated with the waypoints to the simulated object. In some examples, such waypoints may be used as constraints (rigid parameters which must be met by an object in simulation) and/or costs (penalizations for deviations from the parameters) associated with the simulated object. In at least some simulations, a portion of the waypoints may comprise constraints and a remainder of the waypoints may comprise costs. In some instances, computing device(s) 232 can determine costs associated with various simulated trajectories of the simulated object in the environment. For example, the waypoint attributes component 242 can determine that applying the attributes associated with the waypoint to the simulated vehicle can have a particular simulation cost. As discussed above, the simulation cost can include a position cost, a time cost, an action cost, reference cost, an obstacle cost, an acceleration cost, and/or a steering cost, or any other cost associated with parameters of the simulated entity.

In some instances, the waypoint attributes component 242 can allow a user to add waypoints, remove waypoints, and/or modify waypoints as well as the attributes associated with the waypoints. For purposes of illustration only, a user can modify the existing waypoint associated with the turn as discussed above. The user can modify the speed attribute from 5 mph to 7 mph. In some examples, a user can specify whether the waypoint should be treated like a cost, like a constraint, and/or any weight associated therewith. In some instances, the waypoint attributes component 242 can determine a difference between the original speed attribute and the modified speed attribute.

In some instances, the waypoint attributes component 242 can associate a weight with an attribute associated with a waypoint. As discussed above, a weight can be associated with waypoint(s) or cost(s) to be evaluated with respect to each waypoint. For purposes of illustration only, a first weight can be associated with an obstacle cost (e.g., a cost associated with a distance between a simulated object and another object in a simulated environment) and a second weight can be associated with a position cost (e.g., a cost associated with the simulated object being at a particular location in the simulated environment (e.g., at a specific time in the simulation)). A first trajectory may result in an increased distance between a simulated object and an obstacle in a simulated environment but may not result in the simulated object arriving at a particular location by a particular time. A second trajectory may result in a relatively smaller distance between the simulated object and an obstacle in the simulated environment and may result in the simulated object arriving at the particular location by the particular time. In some instances, the first and/or the second trajectory can be determined prior to executing either the first trajectory and/or the second trajectory. In some instances, the first trajectory and/or the second trajectory can be determined while executing a current trajectory of the vehicle. In other words, the first trajectory and/or the second trajectory can provide an alternate route. Based on the first and second weights, a controller associated with the simulated object may determine a trajectory for the simulated object to traverse in the simulated environment.

The filtering component 244 can filter out objects represented in the log data and prevent the objects from being represented in the simulated scenario. The filtering component 244 can filter objects based on an object/classification type (car, pedestrian, motorcycle, bicyclist, etc.), an object size (e.g., length, width, height, and/or volume), a confidence level, track length, an amount of interaction between the object and a vehicle generating the log data, and/or a time period. For example, the log data can represent a pedestrian and a cyclist. The filtering component 244 can be configured to filter out the pedestrian resulting in a simulated scenario that only contains the cyclist.

The filtering component 244 can filter pedestrians as an object type filter from the log data. In some instances, the filtering component 244 can filter objects that are smaller than a particular volume as an object size type filter. In some instances, the log data can include a confidence level associated with objects identifying by the perception component 224 and filter objects that do not meet or exceed a confidence threshold. In some instances, the filtering component 244 can filter objects based on an amount of interaction with the vehicle 202. For example, the log data can indicate that an animal walked in a direction opposite of the vehicle 202 and did not interact the vehicle 202 and/or did not affect the vehicle's 202 trajectory. Then, the filtering component 244 can filter the animal as it does not meet or exceed an interaction threshold. In some instances, the filtering component 244 can filter an object based on an amount of time that the object is represented in the log data. For example, an object can be represented in the log data for half of a second and turn a corner and be obscured by a building. Then, the filtering component 244 can filter the object if it does not meet or exceed a time period threshold.

The filtering component 244 can also override a filter. For example, a user can select an object that has been filtered and override the filter such that the object is represented as a simulated object in the simulated scenario. Similarly, the user can select a simulated object in the simulated scenario and filter the object.

The scenario component 246 can use the log data identified by the log data component 238, the waypoint data generated by the waypoint attributes component 242, and the filters generated by the filtering component 244 to generate a simulated scenario. The simulated scenario includes a simulated environment (e.g., roadways, road markers, buildings, etc.) and simulated objects (e.g., other vehicles, pedestrians, cyclists, animals, etc.). In some instances, the scenario component 246 can use the perception data generated by the perception component 224 to apply simulated object models to the simulated objects. For example, the scenario component 246 can identify a simulated vehicle model and apply it to the simulated objects associated with vehicles. In some instances, the scenario component 246 can identify a simulated pedestrian model and apply it to the simulated objects associated with pedestrians. In some instances, the simulated object models can use controllers that allow the simulated objects to react to the simulated environment and other simulated objects (e.g., modeling physics-based behaviors and incorporating collision checking). For example, a simulated vehicle object can stop at a crosswalk if a simulated pedestrian crosses the crosswalk as to prevent the simulated vehicle from colliding with the simulated pedestrian.

In some instances, the log data can indicate that a particular object has a characteristic and apply that characteristic to the simulated object. For purposes of illustration only, the log data can indicate that an object travels at approximately 10 mph below the speed limit and accelerates slowly. The scenario component 246 can determine that the object is a cautious vehicle and apply a cautious object model to the corresponding simulated object in the simulated environment. In some instances, the scenario component 246 can determine, based on behavior data in the log data, that an object as an aggressive object, a passive object, a neutral object, and/or other types of behaviors and apply behavior instructions associated with the behavior (e.g., a passive behavior, a cautious behavior, a neutral behavior, and/or an aggressive behavior) to the simulated object.

In some instances, the scenario component 246 can infer a status of simulated objects. For example, the scenario component 246 can, based on the log data, place a traffic light that indicates a red light in a north and south direction. Additionally, the log data can represent objects facing an east and west direction at the traffic light that have moved through the intersection of the traffic light. Based on the log data, the scenario component 246 can infer that the traffic lights that face east and west indicate a green light traffic light status.

The scenario component 246 can access, via network(s) 216, third-party source(s) and/or system(s) 248 and obtain supplemental data. In some instances, the scenario component 246 can leverage such supplemental data to supplement the simulated environment. The supplemental data can, in some instances, go beyond the current data set such that the supplemental data provides information associated with the real environment that is not otherwise available due to occlusion(s) and/or other deficiencies associated with the data collection techniques. In some instances, the supplemental data can include U.S. Geological Survey (USGS) Data Evaluation Model (DEM) data, etc. The USGS DEM data can comprise a dataset with raster elevation data (e.g., a digital elevation map). The USGS DEM data may not be as accurate as the associated data (e.g., the road network data and the road mesh); however, the USGS DEM data is often more complete. That is, the USGS DEM data may not have holes and thus, such data can be used to supplement data sets that are missing data (e.g., due to occlusions or other deficiencies in data collection). In some instances, the supplemental data can include tree map data associated with a real environment, color imagery data associated with a real environment, map data associated with an environment, etc.

The scenario editor component 250 can allow a user to modify the scenario generated by the scenario component 246. For example, as discussed above, the user can, using the filtering component 244, remove simulated objects from the simulated scenario and/or add in objects that the filtering component 244 removed. In some instances, the user can add new simulated objects that do not correspond to the log data. For example, the log data can represent three objects and the user can add in a fourth simulated object in the simulated scenario. Additionally, the scenario editor component 250 can allow a user to modify attributes of objects. For example, a user can modify a size of an object or an object behavior of an object. In some instances, the scenario editor component 250 can render a graphical representation of the simulated scenario on the computing device(s) 232 and/or a computing device associated with the user. In some instances, the scenario editor component 250 can render a user interface that allows the user to perform the functions discussed above.

The simulation component 252 can execute the simulated scenario as a set of simulation instructions and generate simulation data. In some instances, the simulation component 252 can execute multiple simulated scenarios simultaneously and/or in parallel. This can allow a user to edit a simulated scenario and execute permutations of the simulated scenario with variations between each simulated scenario.

Additionally, the simulation component 252 can determine an outcome for the simulated scenario. For example, the simulation component 252 can execute the scenario for use in a simulation for testing and validation. The simulation component 252 generate the simulation data indicating how the autonomous controller performed (e.g., responded) and can compare the simulation data to a predetermined outcome and/or determine if any predetermined rules/assertions were broken/triggered.

In some instances, the predetermined rules/assertions can be based on the simulated scenario (e.g., traffic rules regarding crosswalks can be enabled based on a crosswalk scenario or traffic rules regarding crossing a lane marker can be disabled for a stalled vehicle scenario). In some instances, the simulation component 252 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario.

Based at least in part on determining that the autonomous controller performed consistent with the predetermined outcome (that is, the autonomous controller did everything it was supposed to do) and/or determining that a rule was not broken or an assertion was not triggered, the simulation component 252 can determine that the autonomous controller succeeded. Based at least in part on determining that the autonomous controller performance was inconsistent with the predetermined outcome (that is, the autonomous controller did something that it wasn't supposed to do) and/or determining that a rule was broken or than an assertion was triggered, the simulation component 252 can determine that the autonomous controller failed. Accordingly, based at least in part on executing the simulated scenario, simulation data can indicate how the autonomous controller responds to each simulated scenario, as described above and determine a successful outcome or an unsuccessful outcome based at least in part on the simulation data. Successful validation of a proposed controller system may subsequently be downloaded by (or otherwise transferred to) a vehicle for further vehicle control and operation.

The processor(s) 218 of the computing device(s) 204 and the processor(s) 234 of the computing device(s) 232 can be any suitable processor capable of executing instructions to process data and perform operations as described herein. By way of example and not limitation, the processor(s) 218 and 234 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 220 computing device(s) 204 and the memory 236 of the computing device(s) 232 are examples of non-transitory computer-readable media. The memory 220 and 236 can store an operating system and one or more software applications, instructions, programs, and/or data to implement the methods described herein and the functions attributed to the various systems. In various implementations, the memory 220 and 236 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, in some instances, the components in the memory 220 and 236 can be implemented as a neural network.

Some figures (e.g., FIGS. 3 and 5 discussed below) include numbering such as ①, ②, ③, etc. This numbering is intended to orient a reader to one possible order of operations, but is not intended to be construed as a limitation, as discussed herein.

Figure 3:
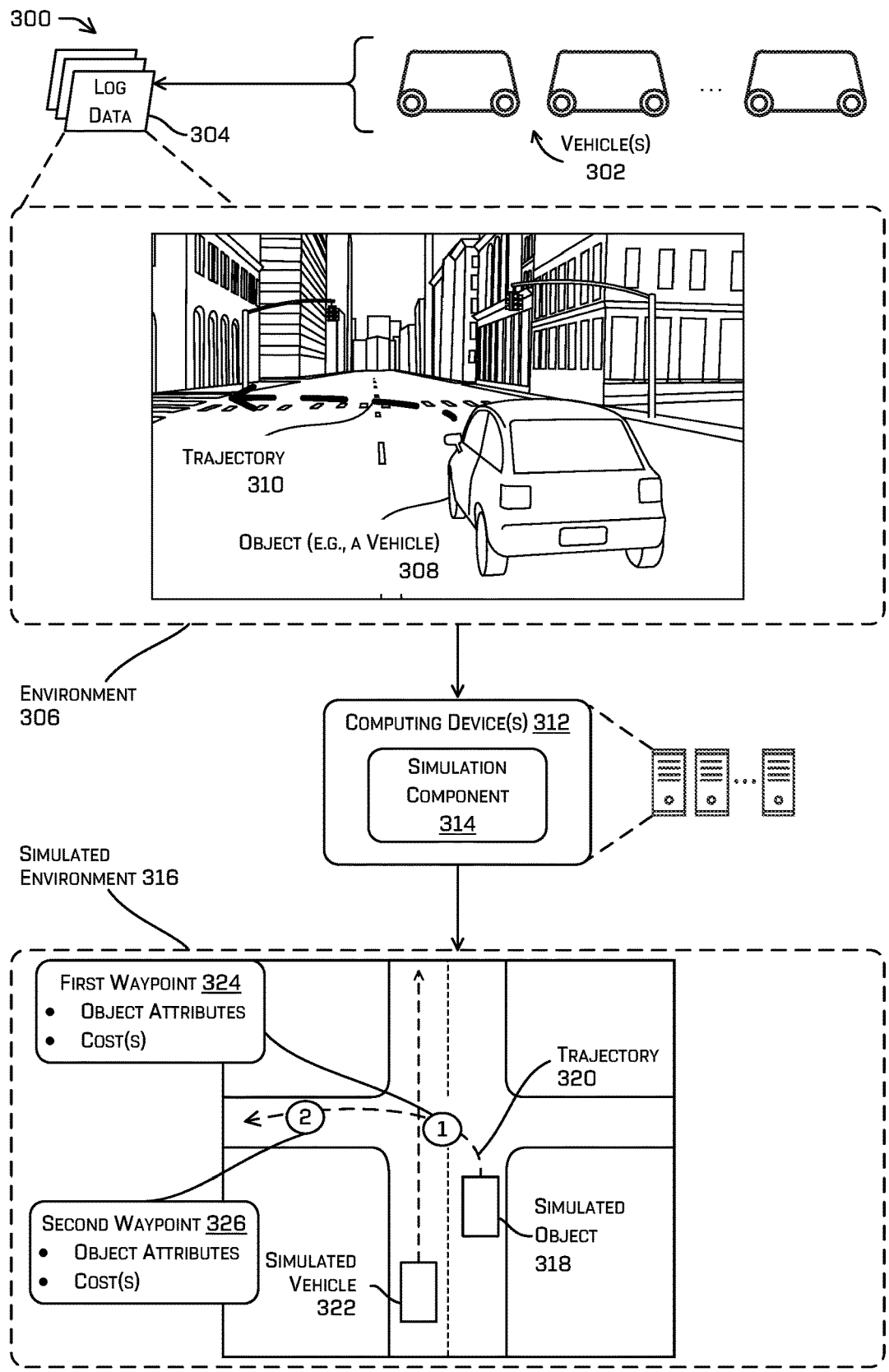
FIG. 3 depicts an object in an environment following a trajectory and a simulated object in a simulated environment following a similar trajectory.

FIG. 3 illustrates an example 300 including vehicle(s) 302 generating log data 304 associated with an environment 306. The environment 306 depicts a perspective of a vehicle that observes an object 308 that takes a left hand turn along trajectory 310. As discussed above, the log data 304 can be transmitted to a computing device(s) 312 that includes a simulation component 314. The computing device(s) 312 can be similar to the computing device(s) 232 and the simulation component 314 can be similar to the simulation component 252 described above with reference to FIG. 2. The computing device(s) 312 can, using the log data 304, generate the simulated environment 316. Depicted in the simulated environment 316 is the simulated object 318 which can correspond to the object 308 and trajectory 320 which can correspond to the trajectory 310. The simulated vehicle 322 can represent vehicle(s) 302 that observed environment 306.

The waypoints attributes component 242 can determine the first waypoint 324 at location ① and the second waypoint 326 at location ②. When the computing device(s) 312 executes the simulated scenario, the computing device(s) 312 can generate a trajectory that respects or otherwise represents the attributes associated with the waypoints 324 and/or 326 (e.g., by minimizing a difference between a trajectory of the object in simulation and the observed trajectory of the object). For example, the simulated object 318 can traverse the simulated environment 316 such that, when the simulated object 318 reaches the first waypoint 324, the behavior of the simulated object 318 is substantially similar (at least in part and within a threshold) to the attributes associated with the first waypoint 324. For example, the object attributes can include a speed, a steering angle, yaw rate, acceleration, classification, predicted trajectory, uncertainty, and/or other object parameters. Additionally, cost(s) that indicates a simulation cost (e.g., a reference, cost, an obstacle cost, an acceleration cost, and/or a steering cost) can be determined for the first waypoint 324. For example, cost(s) can be determined based at least in part on object attributes (e.g., a speed, a steering angle, yaw rate, acceleration, classification, predicted trajectory, uncertainty, and/or other object parameters) associated with the trajectory 320. In some instances, the first waypoint 324 can be associated with a threshold such that if determined cost(s) meet or exceed a threshold, the candidate trajectory can be rejected or modified to determine a trajectory with cost(s) that do not exceed the threshold. Similarly, when the simulated object 318 reaches the second waypoint 326, the behavior of the simulated object 318 has parameters substantially similar (at least in part and within some threshold) to the attributes associated with the object attributes of the second waypoint 326.

Figure 4:
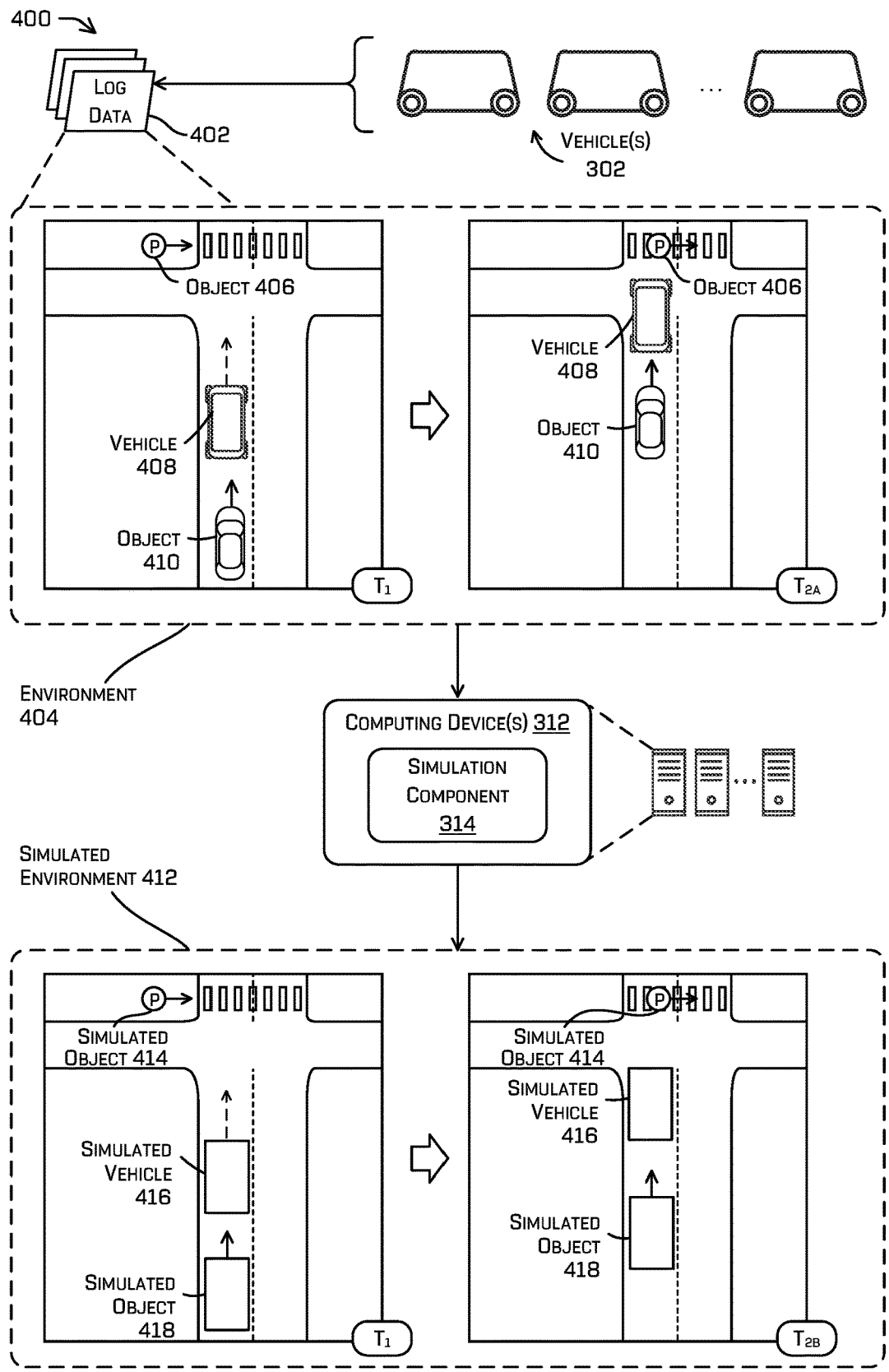
FIG. 4 depicts a vehicle and an object in an environment at a first and a second time and a simulated vehicle and a simulated objected in a simulated environment at a first and second simulated time.

FIG. 4 illustrates and example 400 including vehicle(s) 302 generating log data 402 associated with environment 404. Environment 404 depicts a state of the environment at a time $T_1$ and at a time $T_{2A}$. At time $T_1$, the object 406 can represent a pedestrian crossing a crosswalk. The vehicle 408 can be one of vehicle(s) 302 with a trajectory that leads toward the crosswalk. The object 410 can be a different vehicle that is following the vehicle 408. At time $T_{2A}$, the vehicle 408 can come to stop in an intersection but before entering the crosswalk and the object 410 has come to a stop behind the vehicle 408. The log data 402 can be transmitted to the computing device(s) 312 to generate the simulated environment 412 based on the log data 402 and the environment 404. At time $T_1$ in simulated environment 412, the positions of simulated object 414, simulated vehicle 416, and simulated object 418 can be similar to or can be the same as the positions of object 406, vehicle 408, and object 410 at time $T_1$ in environment 404 respectively. The simulated vehicle 416, however, can be configured to use a controller that is different than the controller used in vehicle 408. Therefore, at time $T_{2B}$ in the simulated environment 412, the simulated vehicle 416 can come to a stop at a position (e.g., not within the intersection) that is farther away from the crosswalk and the simulated object 414. Additionally, time $T_{2B}$ depicts the simulated object 418 coming to a stop such that it does not collide with simulated vehicle 416. By way of example, if the motion of simulated object 418 relied solely on the log data 402, the simulated object 418 would have collided with the simulated vehicle 416. However, the simulated model applied to the simulated object 418 allows the simulation component 314 to determine that the simulated vehicle 416 has come to a stop and prevent a collision by stopping at an earlier point than indicated by the log data 402.

In conducting the stop as depicted at time $T_{2B}$, the simulated vehicle 416 can perform a cost analysis. For example, the simulation component 314 can determine a cost associated with the simulated vehicle 416 applying a maximum braking (e.g., an emergency stop) which may result in excessive or uncomfortable accelerations for passengers represented in the simulated object 418. Additionally, the simulation component 314 can determine a cost associated with the simulated vehicle 416 applying a minimum braking force, which may result in a collision or near-collision with the simulated object 418. The simulation component 314 can, using cost minimization algorithms (e.g., gradient descent), determine a trajectory to perform the stop in a safe manner while minimizing or optimizing costs.

In some examples, a weight can be applied to waypoints associated with the simulated object 414 (e.g., the pedestrian) and the simulated object 418 (e.g., the vehicle following the vehicle 408). In some examples, a weight enforcing a position of the simulated object 414 may be high to simulate the simulated object 414 passing through substantially the same points as the corresponding object observed in the log data 402. However, a weight associated with a waypoint of the simulated object 418 (e.g., associated with a location of the simulated object 418) may be lower to allow the simulated object 418 to react to motion of the simulated vehicle 416 that deviates from the motion of the vehicle 408 in the log data 402. By weighting different attributes (and/or different waypoints), differences between the simulated and observed vehicle may be generated to prioritize aspects of the simulation (e.g., emphasizing fidelity to recorded data or emphasizing physically correct simulations).

Figure 5:
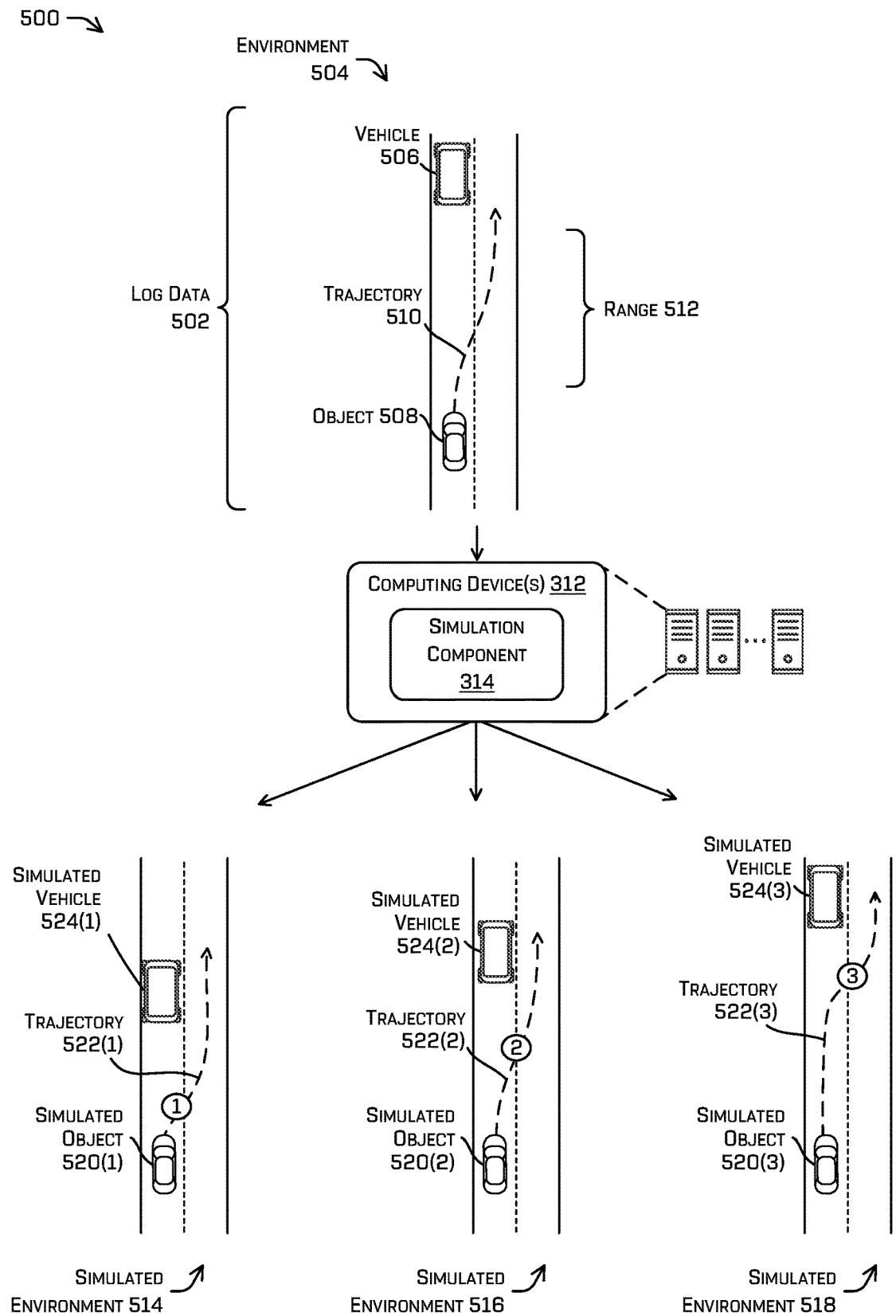
FIG. 5 depicts an example environment and multiple simulated environments of a simulated object traversing multiple trajectories based on the example environment.

FIG. 5 illustrates an example 500 including log data 502 that represents an environment 504. In the environment 504, a vehicle 506 is traversing through the environment and an object 508 is traversing along a trajectory 510. The trajectory 510 allows the object 508 to pass the vehicle 506 by performing a lane change operation to a right lane of the road. The log data 502 can be transmitted to the computing device(s) 312 where the event component 240 can determine the lane change operations as an event of interest. The waypoints attributes component 242 can determine a range 512 associated with the lane change operation where the lane change action is to be simulated at any point within the range 512. In some instances, range 512 can be a time range or a location range. For example, a time range can indicate that a simulated object must perform an action for an amount of time indicated by the time range (e.g., a simulated object can park behind a parked vehicle for a range of 5 seconds to 20 seconds).

The waypoint attributes component 242 can identify three different waypoints (e.g., ①, ②, ③) and the scenario component 246 can generate three different simulated environments 514, 516, and 518. Then, the simulation component 314 can execute the different simulated environments 514, 516, and 518.

The simulated object 520(1)-(3) traverses trajectory 522(1)-(3) to avoid simulated vehicle 524(1)-(3). Each trajectory 522(1)-(3) can be associated with a cost and the controller associated with the simulated object 520(1)-(3) can determine the trajectory to minimize the cost.

For example, simulated environment 514 can provide a scenario where the simulated vehicle 524(1) applied a braking force at an earlier time as compared to the vehicle 506 as indicated in the log data 502. In response to the earlier braking force, the simulated object 520(1) can perform the lane change along trajectory 522(1) at an earlier time but within range 512. Simulated environment 516 can provide a scenario where the simulated vehicle 524(2) behaved similarly to vehicle 506 as indicated in the log data 502. The simulated environment 516 can be used to determine the behavior of simulated object 520(2) and compare with the behavior of object 508. In some instances, this comparison can be used to determine a consistency between the simulated object 520(2) and the object 508. Simulated environment 518 can provide a scenario where the simulated vehicle 524(3) applied a positive accelerating force compared to the vehicle 506 as indicated in the log data 502. In response to the positive accelerating force, the simulated object 520(3) can perform the lane change along trajectory 522(3) at a later time but within range 512.

Figure 6:
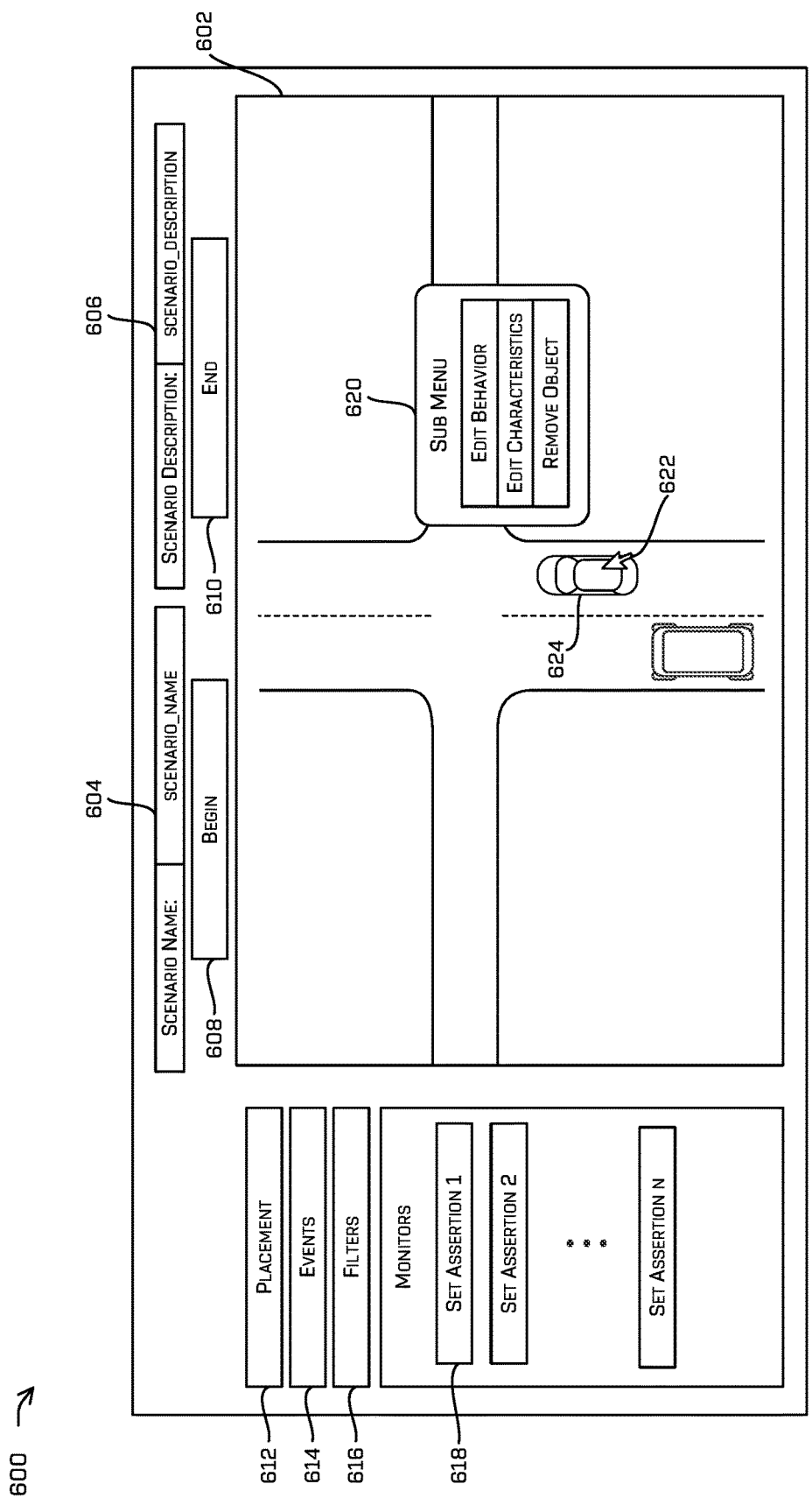
FIG. 6 depicts an example user interface for viewing, executing, and editing a simulated scenario.

FIG. 6 depicts an example user interface 600 for viewing and editing a simulated scenario. The viewing pane 602 can show a graphical representation of the simulated scenario. In field 604, the simulated scenario can be given a name and in field 606, the simulated scenario can be given a description. The begin button 608 can allow a user to begin the simulation and the end button 610 can allow the user to end the simulation. As the simulation executes, the user can view the behavior of the objects as the actions occur.

The placement button 612 can control the placement of objects and allow the user to add additional objects to the simulated scenario. The events button 614 can allow a user to view a list of events of interest as well as edit the events of interest. For example, the user can view the list of events of interest associated with the simulated scenario. In some instances, a timeline view of all events of interest can be displayed (e.g., a lane change at time x, a sudden stop at time y, etc.). For example, the user can begin the simulation and observe an action, such as a turn, taken by an object. The user can then use the events button 614 to add the turn as an event of interest which can force the simulation to perform that event. Additionally, the user can modify waypoints associated with the event of interest, cost(s), and/or cost thresholds associated with the event of interest. In some instances, the user can create an event of interest such as an emergency stop associated with a trajectory of a simulated object. Then, while executing the simulated scenario, the simulated object can perform the emergency stop.

The filter button 616 can allow a user to view the existing filters that are applied to the simulated scenario as well as edit the filters and/or disable one or more filters. For example, and as discussed above, the user can use the filters to objects based on parameters such as an object type, a confidence level, an amount of interaction, a size, a track length, and/or a time period. The assertion button 618 can allow a user to assign assertions associated with the simulated scenario. For example, a user can define an assertion that triggers when an object overlaps with another object. This can indicate that a collision has occurred and when the assertion triggers, the user can be notified and/or as assertion marker can be associated with the simulation data. As discussed above, an assertion triggering can indicate that the autonomous controller and/or a simulated object performed an action that it was not supposed to do and, subsequently, cause the test to fail.

The sub menu 620 can be configured to allow a user to adjust parameters associated with the simulated environment and/or simulated objects. For example, a user can use a cursor 622 to select a simulated object 624. After selecting the simulation object 624, the sub menu 620 can allow the user to adjust a behavior of the simulated object 624, edit characteristics of the simulated object 624, and/or remove the simulated object 624. For example, as discussed above, the user can edit events of interest associated with the simulated object 624. This can force the simulated object 624 to perform an action in the simulated scenario. In some instances, the user can adjust a waypoint associated with a trajectory of the simulated object 624. The user can move a position of the waypoint and/or attributes of the waypoint such as a cost threshold. In some instances, the user can edit a size, pose, or type of the simulated object 624. For example, the simulated object 624 can represent a particular size of vehicle and the user can change it to represent a different size of vehicle or a different type of vehicle (e.g., editing the simulated object 624 to be a cyclist rather than a vehicle).

Figure 7:
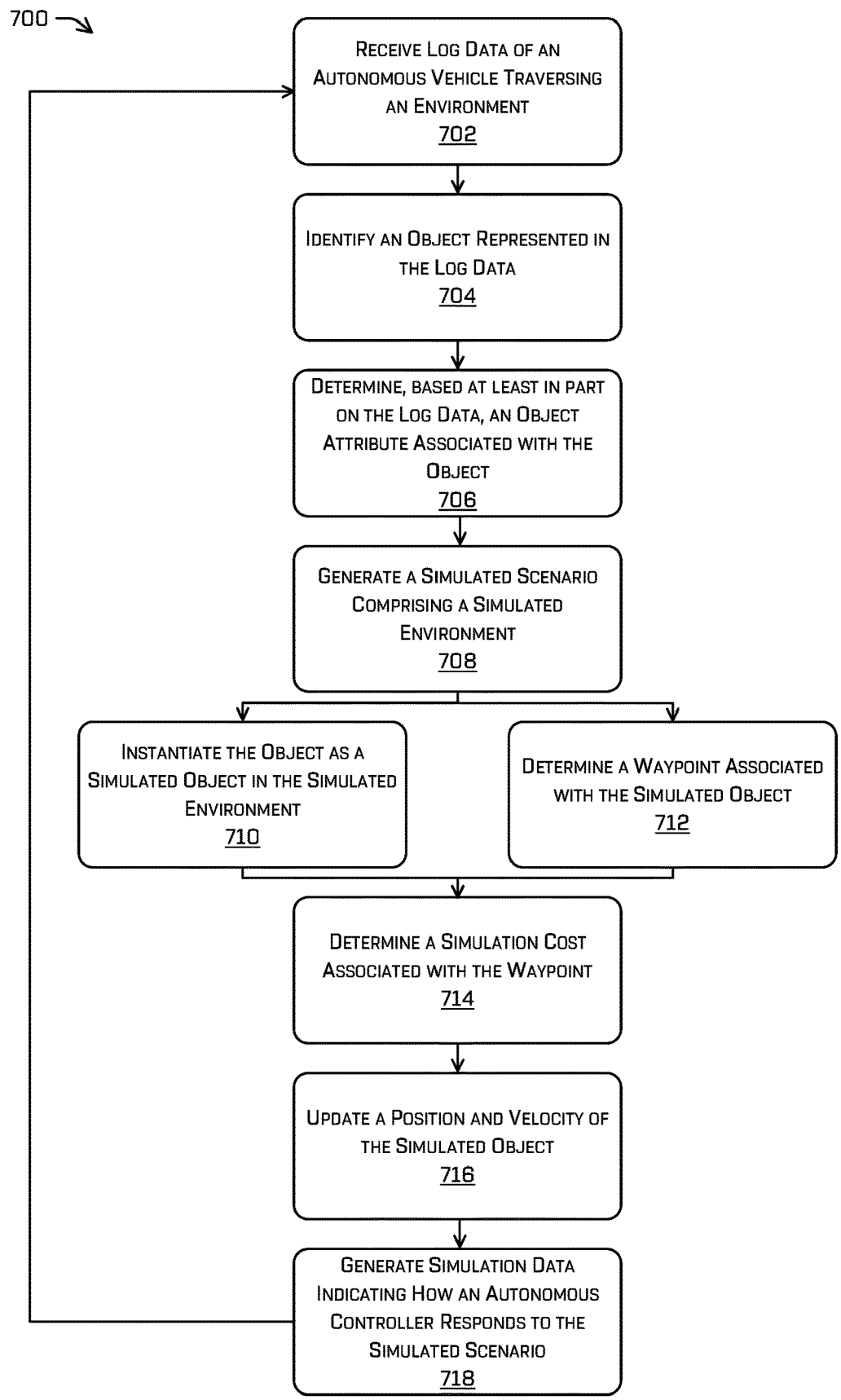
FIG. 7 depicts an example process for generating simulation data based on log data captured by a vehicle traversing an environment.

FIG. 7 depicts an example process 700 for executing the simulated scenario and generating simulation data. In some instances, some or all of process 700 can be performed by one or more components in FIG. 2, as described herein. The process 700 is described with reference to the vehicle 202 and the computing device(s) 232 in FIG. 2. Additionally, some portions of process 700 can be omitted, replaced, and/or reordered while still providing the functionality of determining whether a computing device should remain in a standby state.

At operation 702, the log data component 238 can receive the log data of an autonomous vehicle traversing an environment. In some instances, the log data component 238 can identify log data within a database that stores a plurality of log data.

At operation 704, the process 700 continues by identifying an object represented in the log data. In some instances, the object can be the vehicle 202 that generated the log data. In some instances, the object can be an object in the environment that is distinct from the vehicle 202.

At operation 706, the process 700 can determine an attribute associated with the object. For example, the log data can indicate a speed, a steering angle, a yaw rate, an acceleration, a classification, a predicted trajectory, an uncertainty, and/or other object parameters associated with the object.

At operation 708, the scenario component 246 can generate a simulated scenario based at least in part on the log data that comprises a simulated environment. As discussed above, the scenario component 246 can generate the simulated environment. The simulated environment can include roadways, road markers, buildings, signage, traffic lights, etc.

At operation 710, the scenario component 246 can instantiate the object as a simulated object in the simulated scenario. As discussed above, the scenario component can, in some instances, use the filtering component 244 to filter objects and/or portions of the environment that do not meet or exceed a threshold.

At operation 712, the waypoint attributes component 242 can determine a waypoint associated with the simulated object. For example, an object can have a trajectory associated with one or more waypoints. The waypoint can be associated with attributes such as, for example, a speed, acceleration, yaw rate, uncertainty, classification, trajectory, trajectory uncertainty, and/or a steering angle, among any other object data. In some instances, the user can create a new waypoint that allows a simulated object to deviate from the trajectory represented in the log data.

At operation 714, the waypoint attributes component 242 can determine a simulation cost associated with the waypoint. As discussed above, a waypoint can be associated with attributes and, in some instances, the waypoint can cause an object to deviate from the trajectory represented in the log data. As discussed above, the simulation cost can represent a cost such as, for example, a computational resource and/or an energy/fuel cost associated with the waypoint. In some examples, one or more waypoints may be designated as constraints. In those examples in which the waypoints are associated with one or more costs, the costs may have associated weights allowing a user to emphasize that it is more important for one or more attributes to more closely adhere to the original log data associated with the object over other attributes.

At operation 716, the process 700 can update a position and velocity of the simulated object. As discussed above, the simulated object can reach a waypoint and, based on a simulation cost, update the position and velocity of the simulated object. In some instances, the simulated object's position and/or velocity can be updated based on a control of the simulated object using an object controller. The object controller can determine an object state and adjust a control of the object to update the simulated object's position and/or velocity.

At operation 718, the simulation component 252 can generate simulation data that can indicate how an autonomous controller responds to the simulated scenario. As discussed above, the user can cause the simulated scenario to execute via a user interface that can also allow the user to view a graphical representation of the scenario and edit the scenario.

Accordingly, the techniques discussed herein provide a robust implementation of a scenario editor and simulator to allow for robust simulation of autonomous vehicles increasing the safety of the vehicles.

EXAMPLE CLAUSES

A: A system comprising: one or more processors; and one or more computer-readable media storing computer-executable instructions that, when executed, cause the one or more processors to perform operations comprising: receiving log data comprising sensor data generated by a sensor on an autonomous vehicle traversing an environment; identifying an object represented in the log data; determining, based at least in part on the log data, an object attribute associated with the object; generating a simulated scenario comprising a simulated environment; instantiating the object as a simulated object in the simulated environment, the simulated object having simulated attributes based at least in part on the object attribute; determining a waypoint associated with the simulated object; determining a simulation cost associated with the waypoint; updating a position and velocity of the simulated object in the simulated scenario; and generating simulation data indicating how an autonomous controller responds to the simulated scenario.

B: The system of paragraph A, wherein the log data further comprises at least one of: perception data associated with the object and generated by the autonomous vehicle and based at least in part on the sensor data; prediction data associated with the object and generated by the autonomous vehicle; vehicle state data of the autonomous vehicle; or control data associated with the autonomous vehicle.

C: The system of paragraph A, wherein the log data is associated with one or more of: a lane change of the object; a collision with the object; an acceleration of the object; or a traffic violation by the autonomous vehicle.

D: The system of paragraph A, the operations further comprising: updating a state of the simulated object in the simulated scenario, wherein updating the position and velocity of the simulated object is based at least in part on the simulation cost and comprises: determining, based at least in part on an object controller, a control to be performed by the object; determining, based at least in part on the control, an object state, the object state comprising at least an object position and an object velocity; and altering the control.

E: The system of paragraph A, the operations further comprising: determining an event associated with the log data, the event indicating at least an error condition.

F: A method comprising: receiving data comprising sensor data generated by a sensor in an environment; determining an object represented in the data; determining, based at least in part on the data, a plurality of attributes associated with the object; generating a simulated environment; instantiating, based at least in part on the plurality of attributes, the object as a simulated object in the simulated environment; instantiating a simulated autonomous vehicle in the simulated environment; controlling the simulated autonomous vehicle based at least in part on a vehicle controller; controlling the simulated object based at least in part on an object controller; and generating simulation data indicative of a plurality of controls output by the vehicle controller or a plurality of vehicle states.

G: The method of paragraph F, wherein the data is associated with an event, the method further comprising: determining the event associated with the data; and determining a time range associated with the event, wherein the simulation data indicates how at least one of the vehicle controller or the simulated object responds to the simulated environment.

H: The method of paragraph F, wherein the plurality of attributes comprises at least one of: a velocity of the object; an acceleration of the object; a position of the object; an orientation of the object; a bounding box representing the object; an uncertainty associated with the object; or a classification of the object.

I: The method of paragraph F, further comprising: filtering, as filtered data, at least a portion of the data, wherein the simulated environment comprises the filtered data at an exclusion of other data.

J: The method of paragraph I, wherein filtering at least a portion of the data comprises at least one of: selecting a subset of the at least a portion of the data associated with a classification; selecting a subset of the at least a portion of the data associated with a confidence level that meets or exceeds a threshold confidence level; selecting a subset of the at least a portion of the data associated with at least a minimum volume; selecting a subset of the at least a portion of the data associated with a minimum track length; or selecting a subset of the at least a portion of the data associated with a minimum time period.

K: The method of paragraph F, wherein controlling the simulated object comprises: determining, based at least in part on the data, a waypoint, the waypoint comprising an associated waypoint attribute; generating a candidate trajectory of the object; determining, as a cost, a difference between the associated waypoint attribute and the candidate trajectory; and modifying the candidate trajectory to minimize the cost.

L: The method of paragraph K, wherein the associated waypoint attribute comprises one or more of: a waypoint position, a waypoint velocity, a waypoint acceleration, or a waypoint time, and wherein the proposed trajectory comprises one or more of a simulated object position, a simulated object velocity, a simulated object acceleration, or a simulated object time.

M: The method of paragraph F, the method further comprising: determining a vehicle represented in the data, wherein instantiating the simulated autonomous vehicle comprises instantiating the vehicle as the simulated autonomous vehicle, and wherein the event comprises one or more of: the object performing a lane change, the object making a turn, a vehicle violating a traffic rule, or the vehicle colliding with the object.

N: A non-transitory computer-readable medium storing instructions executable by a processor, wherein the instructions, when executed, cause the processor to perform operations comprising: receiving data comprising at least one of sensor data or perception data; determining an object associated with the data; generating, based at least in part on the data, a scenario; executing a set of simulation instructions associated with the scenario; and generating, based at least in part on executing the set of simulation instructions, simulation data indicating how a vehicle controller responds to the scenario.

O: The non-transitory computer-readable medium of paragraph N, the operations further comprising: instantiating the object as a simulated object in the scenario; determining a difference between a first portion of the data associated with the object and a second portion of the simulation data associated with the simulated object; and modifying, based at least in part on the difference, a trajectory of the simulated object.

P: The non-transitory computer-readable medium of paragraph N, further comprising: identifying a portion of the data associated with the object, the portion indicating at least one of a confidence level, a time period, or a size; determining a filter associated with the scenario that indicates a threshold, wherein at least one of the confidence level, the time period, or the size is below the threshold; and receiving an override instruction associated with the object; and instantiating, based at least in part on the override instruction, the object as a simulated object in the scenario.

Q: The non-transitory computer-readable medium of paragraph N, the operations further comprising: determining an event associated with the data; and identifying a time range associated with the event, wherein executing the set of simulation instructions is based at least in part on the time range.

R: The non-transitory computer-readable medium of paragraph N, the operations further comprising: receiving user input data comprising at least one of: assertion data, filter data, placement data, behavior data, or attribute data.

S: The non-transitory computer-readable medium of paragraph N, wherein the object is a first object, the operations further comprising: determining a second object associated with the data; and determining an event associated with the data, the event indicating at least one of an error condition, a lane change, a turn, a violation of a traffic rule, a collision, or an acceleration condition; and controlling, based at least in part on executing the set of simulation instructions, a first simulated object associated with the first object using a first object controller and a second simulated object associated with the second object using a second object controller.

T: The non-transitory computer-readable medium of paragraph S, the operations further comprising: determining an outcome associated with the scenario, the outcome being one of successful or unsuccessful.

While the example clauses described above are described with respect to one particular implementation, it should be understood that, in the context of this document, the content of the example clauses can also be implemented via a method, device, system, and/or computer-readable medium.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples can be used and that changes or alterations, such as structural changes, can be made. Such examples, changes or alterations are not necessarily departures from the scope with respect to the intended claimed subject matter. While the steps herein can be presented in a certain order, in some cases the ordering can be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

What is claimed is:

1. A system comprising:
   one or more processors; and
   one or more computer-readable media storing computer-executable instructions that, when executed, cause the one or more processors to perform operations comprising:
     receiving log data comprising sensor data generated by a sensor on an autonomous vehicle traversing an environment;
     identifying an object represented in the log data;
     determining, based at least in part on the log data, an object attribute associated with the object;
     filtering, as filtered log data, at least a portion of the log data;
     generating a simulated scenario comprising a simulated environment, the simulated environment including the filtered log data at an exclusion of other log data;
     instantiating the object as a simulated object in the simulated environment, the simulated object having simulated attributes based at least in part on the object attribute;
     determining a waypoint associated with the simulated object;
     determining a simulation cost associated with the waypoint;
     updating a position and velocity of the simulated object in the simulated scenario; and
     generating simulation data indicating how an autonomous controller responds to the simulated scenario.

2. The system of claim 1, wherein the log data further comprises at least one of:
   perception data associated with the object and generated by the autonomous vehicle and based at least in part on the sensor data;
   prediction data associated with the object and generated by the autonomous vehicle;
   vehicle state data of the autonomous vehicle; or
   control data associated with the autonomous vehicle.

3. The system of claim 1, wherein the log data is associated with one or more of:
   a lane change of the object;
   a collision with the object;
   an acceleration of the object; or
   a traffic violation by the autonomous vehicle.

4. The system of claim 1, the operations further comprising:
   updating a state of the simulated object in the simulated scenario,
   wherein updating the position and velocity of the simulated object is based at least in part on the simulation cost and comprises:
   determining, based at least in part on an object controller, a control to be performed by the object;
   determining, based at least in part on the control, an object state, the object state comprising at least an object position and an object velocity; and
   altering the control.

5. The system of claim 1, the operations further comprising:
   determining an event associated with the log data, the event indicating at least an error condition.

6. A method comprising:
   receiving data comprising sensor data generated by a sensor in an environment;
   determining an object represented in the data;
   determining, based at least in part on the data, a plurality of attributes associated with the object;
   filtering, as filtered data, at least a portion of the data;
   generating a simulated environment comprising the filtered data at an exclusion of other data;
   instantiating, based at least in part on the plurality of attributes, the object as a simulated object in the simulated environment;
   instantiating a simulated autonomous vehicle in the simulated environment;
   controlling the simulated autonomous vehicle based at least in part on a vehicle controller;

controlling the simulated object based at least in part on an object controller; and generating simulation data indicative of a plurality of controls output by the vehicle controller or a plurality of vehicle states.

7. The method of claim 6, wherein the data is associated with an event, the method further comprising:

determining the event associated with the data; and determining a time range associated with the event, wherein the simulation data indicates how at least one of the vehicle controller or the simulated object responds to the simulated environment.

8. The method of claim 6, wherein the plurality of attributes comprises at least one of:

a velocity of the object;

an acceleration of the object;

a position of the object;

an orientation of the object;

a bounding box representing the object;

an uncertainty associated with the object; or a classification of the object.

9. The method of claim 6, wherein filtering at least a portion of the data comprises at least one of:

selecting a subset of the at least a portion of the data associated with a classification;

selecting a subset of the at least a portion of the data associated with a confidence level that meets or exceeds a threshold confidence level;

selecting a subset of the at least a portion of the data associated with at least a minimum volume;

selecting a subset of the at least a portion of the data associated with a minimum track length; or selecting a subset of the at least a portion of the data associated with a minimum time period.

10. The method of claim 6, wherein controlling the simulated object comprises:

determining, based at least in part on the data, a waypoint, the waypoint comprising an associated waypoint attribute;

generating a candidate trajectory of the object;

determining, as a cost, a difference between the associated waypoint attribute and the candidate trajectory; and modifying the candidate trajectory to minimize the cost.

11. The method of claim 10, wherein the associated waypoint attribute comprises one or more of:

a waypoint position, a waypoint velocity, a waypoint acceleration, or a waypoint time, and wherein the candidate trajectory comprises one or more of a simulated object position, a simulated object velocity, a simulated object acceleration, or a simulated object time.

12. The method of claim 7, the method further comprising:

determining a vehicle represented in the data, wherein instantiating the simulated autonomous vehicle comprises instantiating the vehicle as the simulated autonomous vehicle, and wherein the event comprises one or more of:

the object performing a lane change, the object making a turn, a vehicle violating a traffic rule, or the vehicle colliding with the object.

13. A non-transitory computer-readable medium storing instructions executable by a processor, wherein the instructions, when executed, cause the processor to perform operations comprising:

receiving data comprising at least one of sensor data or perception data;

determining an object associated with the data;

filtering, as filtered data, at least a portion of the data;

generating, based at least in part on the data, a scenario comprising the filtered data at an exclusion of other data;

executing a set of simulation instructions associated with the scenario; and generating, based at least in part on executing the set of simulation instructions, simulation data indicating how a vehicle controller responds to the scenario.

14. The non-transitory computer-readable medium of claim 13, the operations further comprising:

instantiating the object as a simulated object in the scenario;

determining a difference between a first portion of the data associated with the object and a second portion of the simulation data associated with the simulated object; and modifying, based at least in part on the difference, a trajectory of the simulated object.

15. The non-transitory computer-readable medium of claim 13, further comprising:

identifying a portion of the data associated with the object, the portion indicating at least one of a confidence level, a time period, or a size;

determining a filter associated with the scenario that indicates a threshold, wherein at least one of the confidence level, the time period, or the size is below the threshold;

receiving an override instruction associated with the object; and instantiating, based at least in part on the override instruction, the object as a simulated object in the scenario.

16. The non-transitory computer-readable medium of claim 13, the operations further comprising:

determining an event associated with the data; and identifying a time range associated with the event, wherein executing the set of simulation instructions is based at least in part on the time range.

17. The non-transitory computer-readable medium of claim 13, the operations further comprising:

receiving user input data comprising at least one of:

assertion data, the filtered data, placement data, behavior data, or attribute data.

18. The non-transitory computer-readable medium of claim 13, wherein the object is a first object, the operations further comprising:

determining a second object associated with the data;

determining an event associated with the data, the event indicating at least one of an error condition, a lane change, a turn, a violation of a traffic rule, a collision, or an acceleration condition; and controlling, based at least in part on executing the set of simulation instructions, a first simulated object associated with the first object using a first object controller and a second simulated object associated with the second object using a second object controller.

19. The non-transitory computer-readable medium of claim 18, the operations further comprising:
    determining an outcome associated with the scenario, the outcome being one of successful or unsuccessful.

* * * * *